(12) United States Patent
Lin et al.

(10) Patent No.: US 8,344,921 B2
(45) Date of Patent: Jan. 1, 2013

(54) SIGMA-DELTA MODULATOR WITH SAR ADC AND TRUNCATER HAVING ORDER LOWER THAN ORDER OF INTEGRATOR AND RELATED SIGMA-DELTA MODULATION METHOD

(75) Inventors: Yu-Hsin Lin, Taipei (TW); Hung-Chieh Tsai, Tainan (TW); Sheng-Jui Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 109 days.

(21) Appl. No.: 13/072,797

(22) Filed: Mar. 28, 2011

(65) Prior Publication Data

US 2012/0112943 A1      May 10, 2012

Related U.S. Application Data

(60) Provisional application No. 61/410,219, filed on Nov. 4, 2010.

(51) Int. Cl.
*H03M 3/00*          (2006.01)
(52) U.S. Cl. ......... 341/143; 341/144; 375/340; 375/296
(58) Field of Classification Search .......... 341/143–155; 375/340, 295, 296
See application file for complete search history.

(56) References Cited

U.S. PATENT DOCUMENTS

| 6,967,608 | B1 | 11/2005 | Maloberti | |
|---|---|---|---|---|
| 6,980,144 | B1 | 12/2005 | Maloberti | |
| 7,397,410 | B2 * | 7/2008 | Yang | 341/155 |
| 8,102,292 | B1 * | 1/2012 | Van Ess | 341/143 |
| 8,248,280 | B2 * | 8/2012 | Zhan et al. | 341/143 |

OTHER PUBLICATIONS

Ranjbar, "A 3.1 mW Continuous-Time Delta-Sigma Modulator With 5-Bit Successive Approximation Quantizer for WCDMA", pp. 1479-1491, IEEE journal of solid-state circuits, vol. 45, No. 8, Aug. 2010.

* cited by examiner

*Primary Examiner* — Lam T Mai
(74) *Attorney, Agent, or Firm* — Winston Hsu; Scott Margo

(57) ABSTRACT

A sigma-delta modulator includes a processing circuit, a quantizer, a truncater and a feedback circuit. The processing circuit receives an input signal and an analog information and generates an integrated signal by perform an integration upon a difference between the input signal and the analog information. The quantizer includes a successive approximation register (SAR) analog-to-digital converter (ADC) for receiving the integrated signal and generating a digital information according to the integrated signal. The truncater receives the digital information and generates a truncated information according to the digital information. The feedback circuit generates the analog information to the processing circuit according to the truncated information, wherein an order of the truncater is lower than an order of the integration.

20 Claims, 6 Drawing Sheets

SIGMA-DELTA MODULATOR WITH SAR ADC AND TRUNCATER HAVING ORDER LOWER THAN ORDER OF INTEGRATOR AND RELATED SIGMA-DELTA MODULATION METHOD

CROSS REFERENCE TO RELATED APPLICATIONS

This application claims the benefit of U.S. Provisional Application No. 61/410,219, filed on 2010 Nov. 4 and included herein by reference.

BACKGROUND OF THE INVENTION

1. Field of the Invention

The present invention relates to a modulation technique, and more particularly, to a sigma-delta modulation method and a related sigma-delta modulator.

2. Description of the Prior Art

Sigma-delta modulators are implemented in a variety of applications. For conventional sigma-delta modulators, their performance (e.g., signal-to-noise ratio, SNR) can only be enhanced by increasing an order of the loop filter or increasing a bit number of the quantizer for a given over-sampling ratio. High-order sigma-delta modulations may have stability issues and suffer from unstable oscillation. However, the employment of multi-bit quantizers with an increased number of bits guarantees a resolution boost at the expense of a more complicated circuit structure, leading to undesirable outcomes such as higher power consumption, a larger chip area requirement and a more serious mismatch due to numerous DACs in the feedback path. Therefore, it is a remaining issue to simplify the overall circuit structures of sigma-delta modulators without sacrificing performance, for example, the integrator and the truncater utilized in a traditional sigma-delta modulator may put a certain design restrictions; a better efficiency will be achieved if those components can be realized in more compact topologies.

SUMMARY OF THE INVENTION

It is therefore one of the objectives of the present invention to provide a sigma-delta modulator capable of high-speed operation and good noise performance for a given oversampling ratio. The sigma-delta modulator of the present invention is also able to achieve a compact chip size and a low power consumption.

According to a first aspect of the present invention, a sigma-delta modulator is provided. The sigma-delta modulator includes a processing circuit, a quantizer, a truncater and a feedback circuit. The processing circuit receives an input signal and an analog information and generates an integrated signal by performing an integration upon a difference between the input signal and the analog information. The quantizer includes a successive approximation register (SAR) analog-to-digital converter (ADC) for receiving the integrated signal and generating a digital information according to the integrated signal. The truncater receives the digital information and generates a truncated information according to the digital information. The feedback circuit generates the analog information to the processing circuit according to the truncated information. An order of the truncater is lower than an order of the integration.

According to a second aspect of the present invention, a sigma-delta modulator is provided. The sigma-delta modulator includes a processing circuit, a quantizer, truncater and a feedback circuit. The processing circuit is arranged to perform a subtraction for an input signal and a first analog information to generate a subtraction signal, and perform an integration for the subtraction signal and a second analog information to generate an integrated signal. The quantizer is coupled to the processing circuit and arranged to perform a successive approximation register (SAR) analog-to-digital conversion for the integrated signal to generate a digital information. The truncater is arranged to perform a truncation to generate a truncated information according to the digital information. The feedback circuit is coupled between the processing circuit and the truncater and arranged to perform a digital-to-analog conversion for the truncated information to generate the first analog information and the second analog information. An order of the truncation is lower than or equal to an order of the integration.

According to a third aspect of the present invention, a sigma-delta modulation method is provided. The sigma-delta modulation method includes receiving an input signal and an analog information, and performing an integration process to generate an integrated signal by performing an integration upon a difference between the input signal and the analog information; performing a successive approximation register (SAR) analog-to-digital conversion to generate a digital information according to the integrated signal; performing a truncation to generate a truncated information according to the digital information; and performing a feedback process to generate the analog information to the processing circuit according to the truncated information. An order of the truncation is lower than an order of the integration.

According to a fourth aspect of the present invention, a sigma-delta modulation method is provided. The sigma-delta modulation method includes: performing a subtraction for an input signal and a first analog information to generate a subtraction signal, and performing an integration for the subtraction signal and a second analog information to generate an integrated signal; performing a successive approximation register (SAR) analog-to-digital conversion for the integrated signal to generate a digital information; performing a truncation to generate a truncated information according to the digital information; and performing a digital-to-analog conversion for the truncated information to generate the first analog information and the second analog information. An order of the truncation is lower than an order of the integration process.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
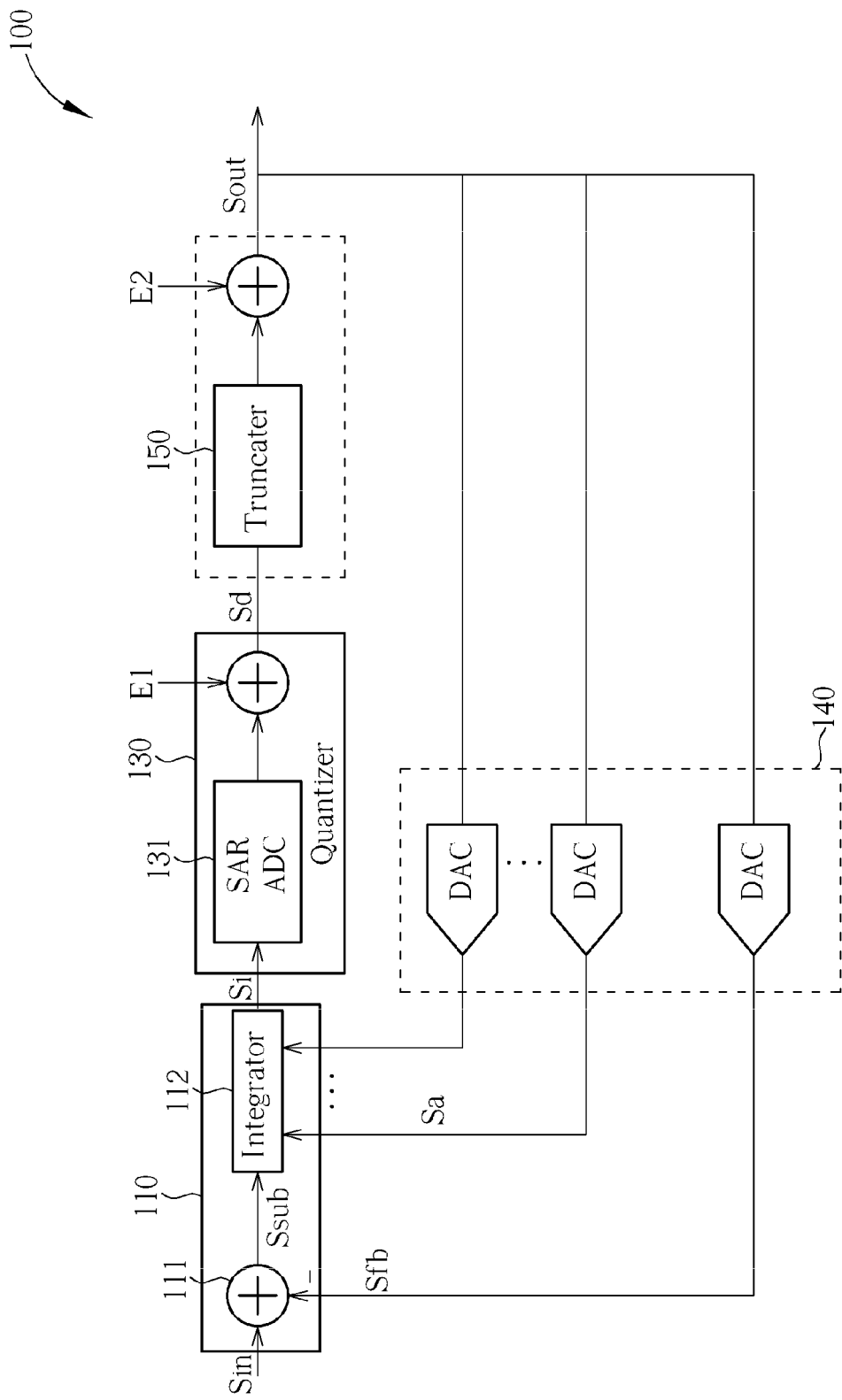
FIG. 1 is an exemplary diagram of a sigma-delta modulator according to an embodiment of the present invention.

Please refer to FIG. 1, which is an exemplary diagram of a sigma-delta modulator 100 according to an embodiment of the present invention. The sigma-delta modulator 100 includes (but is not limited to) a processing circuit 110, a quantizer 130, a feedback circuit 140 and a truncater 150. The feedback circuit 140 includes a plurality of digital-to-analog converters (DACs). A subtracter 111 of the processing circuit 110 subtracts a feedback signal Sfb from an input signal Sin to produce a subtracted signal Ssub. An integrator 112 of the processing circuit 110 performs a series of calculations according to the subtracted signal Ssub and an analog information Sa (i.e., an operation result generated by certain DACs within the feedback circuit 140) to generate an integrated signal Si. The quantizer 130 processes the integrated signal Si to generate a digital signal Sd, and the truncater 150 performs a truncation for the digital signal Sd to generate an output signal Sout.

Please note that, in the quantizer 130, the digital signal Sd is generated according to a sum of a converted signal generated by the integrator 112 and a quantization error E1; however, the quantization error E1 in FIG. 1 is merely a mathematical expression implied in the quantization operation, and the summation element of the quantization error E1 is modeled for linear approximation. Similarly, the output signal Sout is a sum of a truncated error E2 and a truncated signal generated by the truncater 150, wherein the truncated error E2 is also only a mathematical expression implied in the truncation operation. The feedback circuit 140, which is implemented by a plurality of digital-to-analog converters (DACs) in this example, generates the first analog information Sfb and the second analog information Sa to the subtracter 111 and the integrator 112, respectively, according to the output signal Sout (i.e., the truncated information generated by the truncater 150).

The quantizer 130 includes a successive approximation register (SAR) analog-to-digital converter (ADC) 131 to receive the integrated signal Si and generate a digital information Sd according to the integrated signal Si, wherein a quantization error E1, which is inevitable in the practical processing of quantization, will be added in the SAR ADC 131 as a mathematical expression. The truncater 150 thereby receives the digital information Sd and generates a truncated information (the truncated information includes at least a most significant bit (MSB) indicative of the digital information) as an output signal Sout according to the digital information. The truncated information here also includes an inevitable truncation error E2, which is also a mathematical term. According to the embodiments of the invention, the architecture in FIG. 1 can be utilized in the implementation of both discrete-time sigma-delta modulators and continuous-time sigma-delta modulators.

Figure 2:
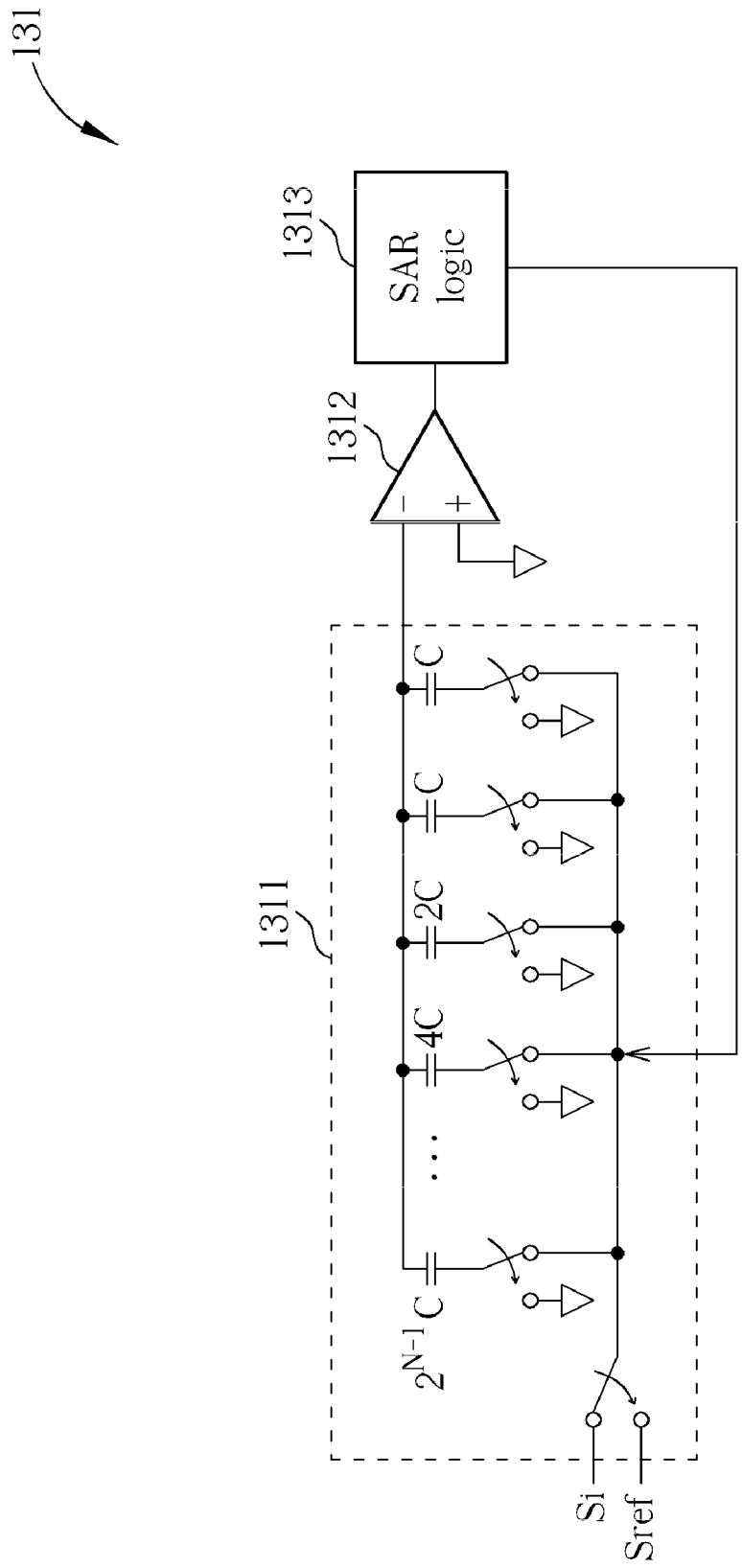
FIG. 2 is an exemplary diagram of the SAR ADC shown in FIG. 1 according to an embodiment of the present invention.

Please refer to FIG. 2, which is an exemplary diagram of the SAR ADC 131 shown in FIG. 1 according to an embodiment of the present invention. The SAR ADC 131, which processes the integrated signal Si with a bit number N, includes a bit control element 1311, an amplifier 1312 and a SAR logic 1313. The bit control element 1311 includes a switch for choosing an output signal from the integrated signal Si and a reference signal Sref, a plurality of bit capacitors distributed in a binary fashion and a plurality of corresponding bit switches. The SAR logic 1313 receives a signal from the buffer 1312 and performs a calculation algorithm (e.g., a binary search algorithm) to generate a bit control signal to set the bit control element 1311. The structure and the operation of circuits in FIG. 2 should be straightforward for those skilled in this field, and therefore further details are omitted here.

The truncater 150 provides a noise shaping function with an equation: truncation noise=$E2 \times ((1-Z^{-1})^M/(1+H(s)))$, wherein H(S) is a loop gain provided by the integrator 120, and M is an order of the truncater 150. In conventional cases, M shall be higher than an order of the integrator 120, or the truncation noise cannot be efficiently suppressed for a reasonable bit number of quantizer 130. Assume an equivalent formula to represent the digital information Sd in FIG. 1 is $B_{K-1}2^{K-1}+B_{K-2}2^{K-2}+\ldots+B_3 2^3+B_2 2^2+B_1 2^1+B_0 2^0$ where K is the bit number at the output of the quantizer 130. If one would like to further reduce the bit number by the truncater 150 after the quantizer 130, the magnitude level of E2 will become $2^T$ times larger than that of E1, where T is the bit number truncated after the truncater 150, e.g., the reduced bit number. In a truncater, the more bit number of truncation one removes, the higher order M is required to suppress the growing truncation noise. If the magnitude level of E1 is reduced by increasing the bit number K at the output of the quantizer 130 for a given truncated bit number T, the tolerance of truncation noise can be larger since E2 can have the same benefit of E1, i.e., E2 is also reduced along with the reduced E1. Accordingly, if the bit number of quantizer 130 can be increased by using an SAR ADC in the quantizer 130 as proposed in the embodiments, the required order M of truncater 150 can thus be lower than the order of the integrator 120 and the corresponding delay caused by the truncater 150 can be mitigated, which is important for realizing high speed continuous time delta sigma modulator.

Please note that, in this embodiment, the inherent noise generated from the SAR ADC 131 is significantly reduced when compared with a flash ADC in the conventional structure since SAR ADC 131 is suitable for high resolution applications under a reasonable area or power. The noise requirement in the following building blocks can thereby be greatly relaxed. As a result, the truncater 150 in the proposed sigma-delta modulator 100 can be implemented as a first-order truncater. Since the truncater, for the sake of noise suppression, shall have an order higher than that of the integrator 120 while utilized in a conventional sigma-delta modulator, more processing time is necessary for the truncation process and therefore a limitation is put upon an operation speed and overall performance of the conventional sigma-delta modulator. The processing time, called excess loop delay technically, may degrade the performance of a sigma-delta modulator, especially for a continuous-time sigma-delta modulator. However, the sigma-delta modulator 100 of the embodiment does not require such a truncation with an order higher than an order of the integrator 112; as a result, a first-order truncater (i.e., the truncater 150) can be utilized to overcome delay problem in high speed continuous-time sigma-delta modulator.

Figure 3:
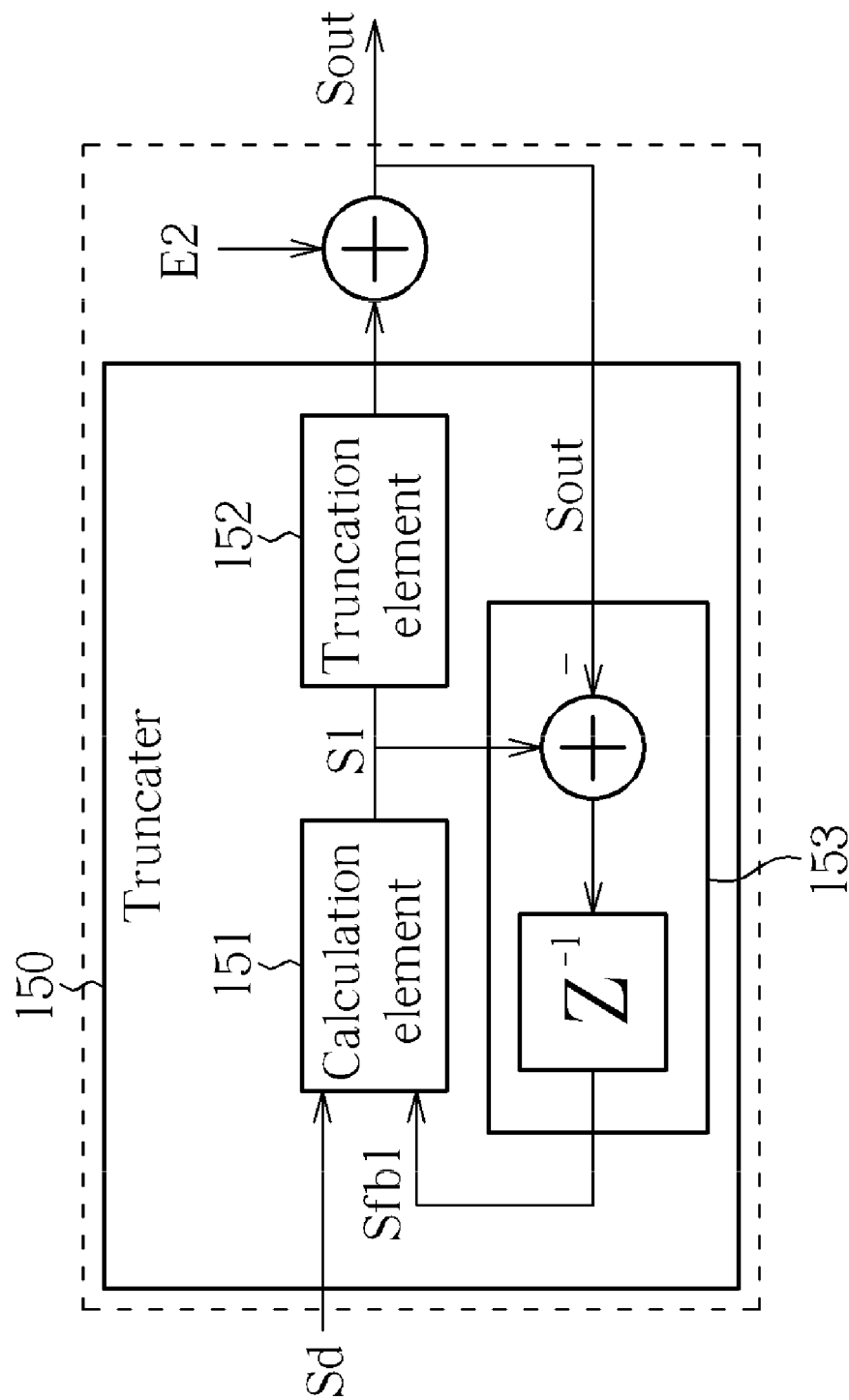
FIG. 3 is an exemplary diagram of the truncater in FIG. 1 according to an embodiment of the present invention.

Pleaser refer to FIG. 3, FIG. 3 is an exemplary diagram of the truncater 150 in FIG. 1 according to an embodiment of the present invention. The truncater 150 includes an adder 151 (i.e., a calculation element), a truncation element 152 and a feedback element 153. The adder 151 calculates a sum of the digital information Sd and a feedback information Sfb1, and thereby outputs a first calculated signal S1. The truncation element 152 performs a truncation process to generate the output signal Sout according to the first calculated signal S1, and the feedback element 153 generates the feedback information Sfb1 according to the first calculation signal S1 and the truncated information Sout. In this embodiment, the feedback element 153 includes an adder and a discrete-time delay cell (for example, a block with an equation: $1-Z^{-1}$) to provide the feedback information Sfb1 according to a difference between the output signal Sout and the first calculation signal S1. As can be seen in FIG. 3, the structure of the truncater 150 is rather simple and contains merely one single feedback loop, so a high operation speed, which is especially essential in the continuous-time sigma-delta modulator, can be achieved.

In addition to the inherent low noise performance, the SAR ADC 131 further provides a number of advantages capable of enhancing the overall performance of the sigma-delta modulator 100. First of all, the SAR ADC 131 can easily generate an additional error correction signal such that the digital information Sd outputted to the truncater 150 contains the additional error correction for further operation. For example, the truncater 150 can generate the truncated information (i.e., the output signal Sout) according to the digital information Sd and the error correction information within the digital information Sd. With the help of the error correction signal, the settling requirement of the quantizer can be released in sigma-delta modulator. Moreover, compared with a flash ADC adopted in a conventional sigma-delta modulator, the SAR ADC 131 consumes much less power and occupies a smaller chip area, and these features make the SAR ADC 131 a more competitive design.

Figure 4:
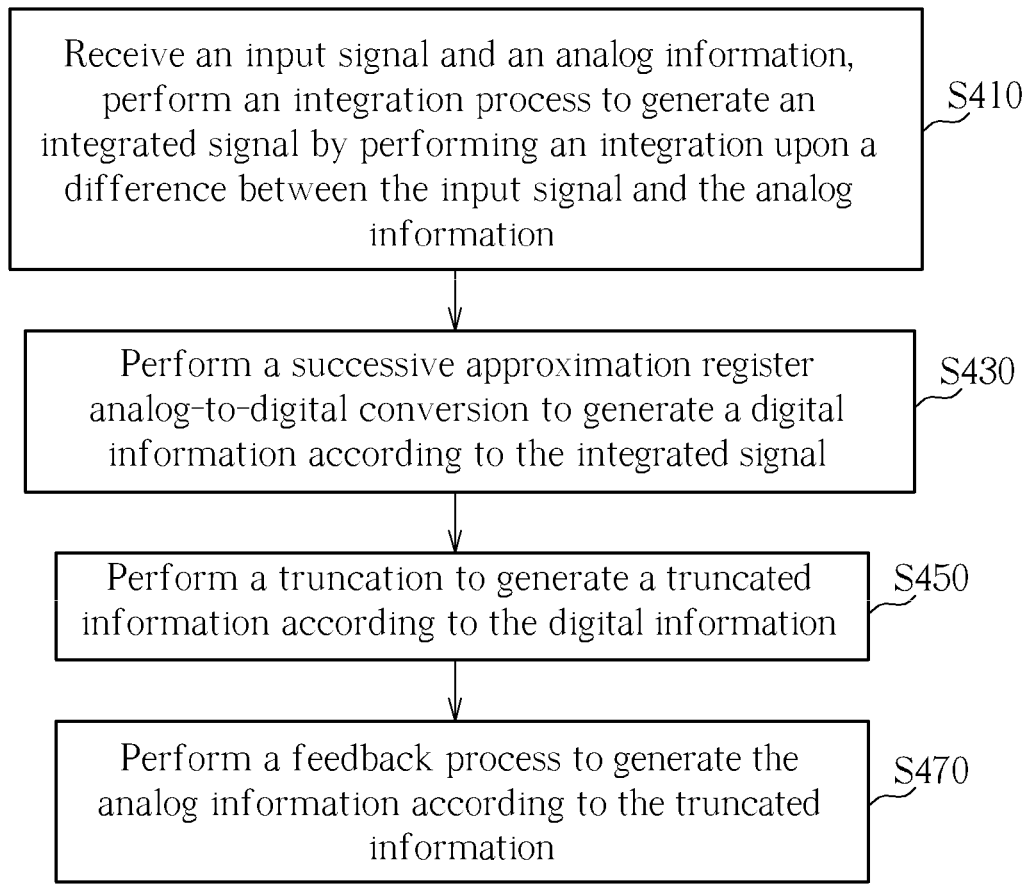
FIG. 4 is a flowchart of an operation of the sigma-delta modulator 100 shown in FIG. 1 according to an embodiment of the present invention.

Please refer to FIG. 4 in conjunction with FIG. 1 for a further illustration of an operation of the sigma-delta modulator 100. FIG. 4 is a flowchart of the operation of the sigma-delta modulator 100 shown in FIG. 1 according to an embodiment of the present invention. If the result is substantially the same, the steps are not required to be executed in the exact order shown in FIG. 4. In addition, the steps in FIG. 4 are not required to be executed sequentially, i.e., other steps can be inserted in between. The steps are detailed as follows:

Step S410: receive an input signal and an analog information, perform an integration process to generate an integrated signal by performing an integration upon a difference between the input signal and the analog information;

Step S430: perform a successive approximation register analog-to-digital conversion to generate a digital information according to the integrated signal;

Step S450: perform a truncation to generate a truncated information according to the digital information, wherein an order of the truncation is lower than an order of the integration process; and Step S470: perform a feedback process to generate the analog information according to the truncated information.

Figure 5:
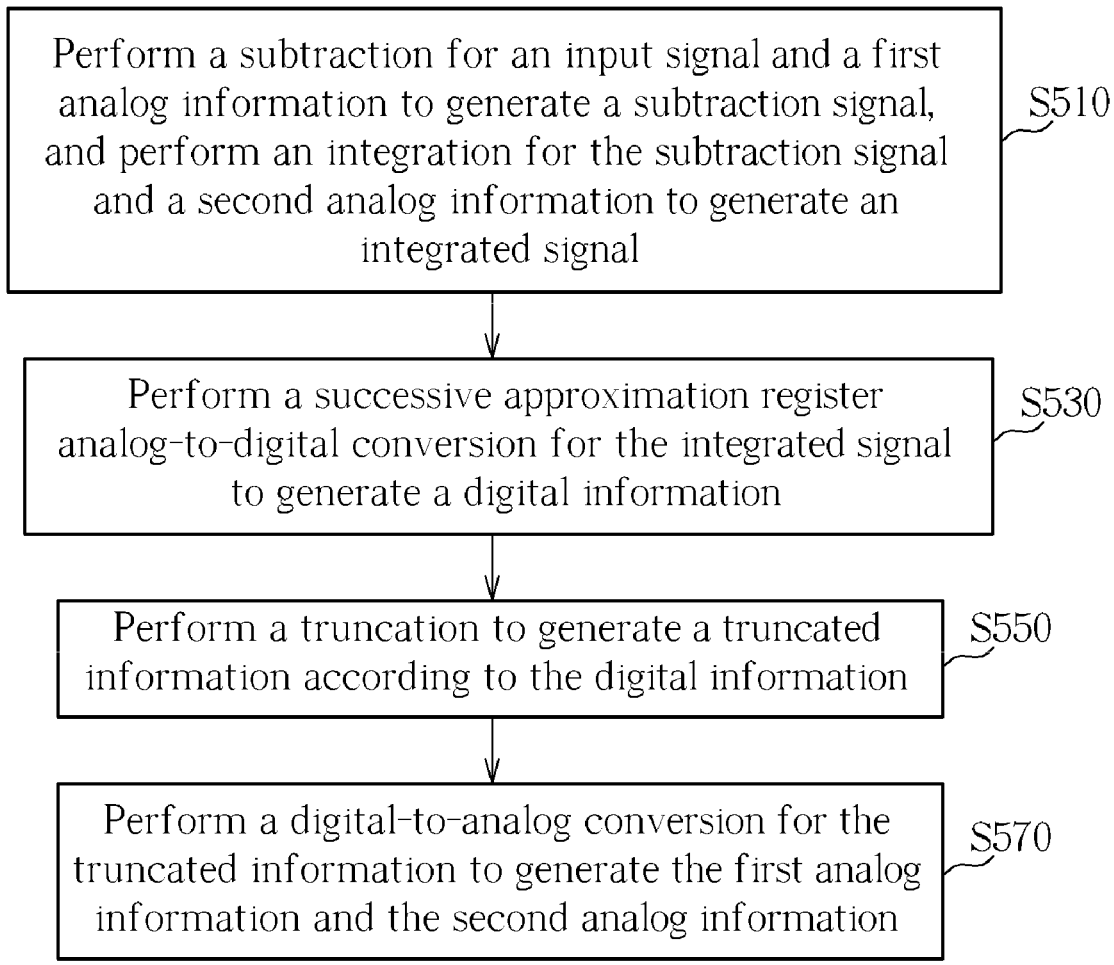
FIG. 5 is a flowchart of the operation of the sigma-delta modulator 100 shown in FIG. 1 according to another embodiment of the present invention.

Please refer to FIG. 5. FIG. 5 is a flowchart of the operation of the sigma-delta modulator 100 shown in FIG. 1 according to another embodiment of the present invention. If the result is substantially the same, the steps are not required to be executed in the exact order shown in FIG. 5. In addition, the steps in FIG. 5 are not required to be executed sequentially, i.e., other steps can be inserted in between. The steps are detailed as follows:

Step S510: receive an input signal Sin and an analog information, perform an integration process to generate an integrated signal by performing an integration upon a difference between the input signal and the analog information;

Step S530: perform a successive approximation register analog-to-digital conversion for the integrated signal to generate a digital information;

Step S550: perform a truncation to generate a truncated information according to the digital information, wherein an order of the truncation is lower than an order of the integration process; and Step S570: perform a digital-to-analog conversion for the truncated information to generate the first analog information and the second analog information.

Figure 6:
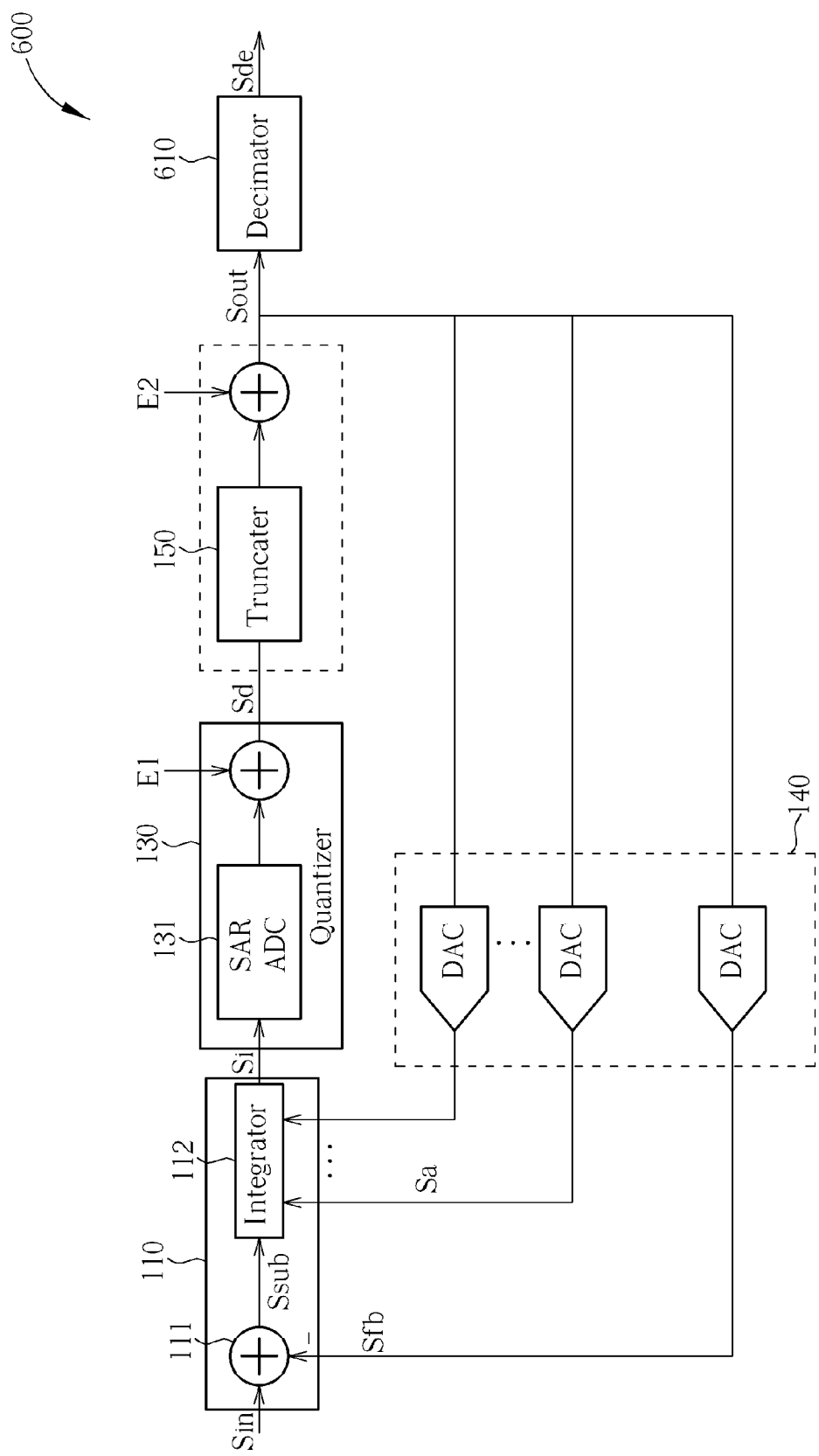
FIG. 6 is an exemplary diagram of a sigma-delta modulator according to another embodiment of the present invention.

The architecture in FIG. 1 is an exemplary embodiment of the present invention and can be easily integrated with other components in typical sigma-delta modulators. For example, please refer to FIG. 6, which is an exemplary diagram of a sigma-delta modulator 600 according to another embodiment of the present invention. The sigma-delta modulator 600 integrates a decimator 610 with the circuitries shown in FIG. 1, and the decimator 610 performs a decimation for the output signal Sout (i.e., digital information outputted from the truncater 150) to generate a decimated signal Sde, and converts the output signal Sout from a high sampling rate into the Nyquist rate. These kinds of variation in design also fall within the scope of the present invention.

To summarize, the embodiments provide a sigma-delta modulator with a SAR ADC as a quantizer. The utilization of the SAR ADC relaxes a noise shaping requirement in the following components, so the subsequent truncation element can thereby be implemented with an order lower than an order of integration. In addition, the sigma-delta modulator can achieve a compact chip size and a low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sigma-delta modulator, comprising:
a processing circuit, arranged to receive an input signal and an analog information and generate an integrated signal by performing an integration upon a difference between the input signal and the analog information;
a quantizer, comprising:
a successive approximation register (SAR) analog-to-digital converter (ADC), arranged to receive the integrated signal and generate a digital information according to the integrated signal;
a truncater, arranged to receive the digital information and generate a truncated information according to the digital information; and
a feedback circuit, coupled between the processing circuit and the truncater, arranged to generate the analog information to the processing circuit according to the truncated information;
wherein an order of the truncater is lower than an order of the integration.

2. The sigma-delta modulator of claim 1, wherein the sigma-delta modulator is a continuous-time sigma-delta modulator.

3. The sigma-delta modulator of claim 1, wherein the digital information generated by the SAR ADC further comprises an error correction information.

4. The sigma-delta modulator of claim 1, wherein the truncater is a first-order truncater.

5. The sigma-delta modulator of claim 4, wherein the truncater comprises:
   a calculation element, arranged to generate a first calculation signal according to a sum of the digital information and a feedback information;
   a truncation element, coupled to the calculation element, arranged to generate the truncated information according to the first calculation signal; and
   a feedback element, coupled to the calculation element and the truncation element, arranged to generate the feedback information according to the first calculation signal and the truncated information.

6. The sigma-delta modulator of claim 1, wherein the truncated information comprises at least a most significant bit (MSB) indicative of the digital information.

7. The sigma-delta modulator of claim 1, further comprising:
   a decimator, arranged to generate a decimated signal according to the digital information as an output signal of the sigma-delta modulator.

8. A sigma-delta modulator, comprising:
   a processing circuit, arranged to perform a subtraction for an input signal and a first analog information to generate a subtraction signal, and perform an integration for the subtraction signal and a second analog information to generate an integrated signal;
   a quantizer, arranged to perform a successive approximation register (SAR) analog-to-digital conversion for the integrated signal to generate a digital information;
   a truncater, arranged to perform a truncation to generate a truncated information according to the digital information; and
   a feedback circuit, coupled between the processing circuit and the truncater, arranged to perform a digital-to-analog conversion for the truncated information to generate the first analog information and the second analog information;
   wherein an order of the truncation is lower than an order of the integration.

9. The sigma-delta modulator of claim 8, wherein the sigma-delta modulator is a continuous-time sigma-delta modulator.

10. The sigma-delta modulator of claim 8, wherein the digital information generated by the SAR ADC further comprises an error correction information.

11. A sigma-delta modulation method, comprising:
    receiving an input signal and an analog information, and performing an integration process to generate an integrated signal by performing an integration upon a difference between the input signal and the analog information;
    performing a successive approximation register (SAR) analog-to-digital conversion to generate a digital information according to the integrated signal;
    performing a truncation to generate a truncated information according to the digital information; and
    performing a feedback process to generate the analog information according to the truncated information;
    wherein an order of the truncation is lower than an order of the integration.

12. The sigma-delta modulation method of claim 11, wherein the sigma-delta modulation method is a continuous-time process.

13. The sigma-delta modulation method of claim 11, wherein digital information generated by the SAR ADC further comprises an error correction information.

14. The sigma-delta modulation method of claim 11, wherein the truncation is a first-order truncation process.

15. The sigma-delta method of claim 14, wherein the step of performing the truncation to generate the truncated information according to the digital information comprises:
    performing a first calculation to generate a first calculation signal according to a sum of the digital information and a feedback information;
    performing a truncation operation to generate the truncated information according to the first calculation signal; and
    performing a feedback operation to generate the feedback information according to a difference between the first calculation signal and the truncated information.

16. The sigma-delta modulation method of claim 11, wherein the truncated information comprises at least a most significant bit (MSB) indicative of the digital information.

17. The sigma-delta modulation method of claim 11, further comprising:
    performing a decimation for the digital information to generate a decimated signal as an output of the sigma-delta modulation method.

18. A sigma-delta modulation method, comprising:
    performing a subtraction for an input signal and a first analog information to generate a subtraction signal, and performing an integration for the subtraction signal and a second analog information to generate an integrated signal;
    performing a successive approximation register (SAR) analog-to-digital conversion for the integrated signal to generate a digital information;
    performing a truncation to generate a truncated information according to the digital information; and
    performing a digital-to-analog conversion for the truncated information to generate the first analog information and the second analog information;
    wherein an order of the truncation is lower than an order of the integration process.

19. The sigma-delta modulation method of claim 18, wherein the sigma-delta modulation is a continuous-time process.

20. The sigma-delta modulation method of claim 18, wherein the digital information generated by the SAR analog-to-digital conversion further comprises an error correction information.

* * * * *